United States Patent [19]
Cooley et al.

[11] 4,383,245
[45] May 10, 1983

[54] DIGITAL SERVOMOTOR DRIVE APPARATUS

[75] Inventors: David J. Cooley, Phoenix; Theodore C. Ebbinga, Scottsdale, both of Ariz.

[73] Assignee: Sperry Corporation, New York, N.Y.

[21] Appl. No.: 202,802

[22] Filed: Oct. 31, 1980

[51] Int. Cl.³ .................. G05B 11/28; H03K 13/02
[52] U.S. Cl. ........................ 340/347 DA; 318/341; 318/599; 318/603
[58] Field of Search ............. 318/599, 603, 341; 347/340 DA

[56] References Cited

U.S. PATENT DOCUMENTS

| | | | |
|---|---|---|---|
| 3,597,693 | 8/1971 | McNeilly | 340/347 DA |
| 3,646,545 | 2/1972 | Naydan et al. | 340/347 DA |
| 3,754,233 | 8/1973 | Sutherland | 340/347 DA |
| 4,105,939 | 8/1978 | Culbertson | 318/599 |
| 4,259,626 | 3/1981 | Nomura et al. | 318/603 X |
| 4,287,458 | 9/1981 | Nakamura et al. | 318/341 |
| 4,311,949 | 1/1982 | Pelkmann et al. | 318/341 X |

*Primary Examiner*—B. Dobeck
*Attorney, Agent, or Firm*—Howard P. Terry

[57] ABSTRACT

An apparatus for converting digital signals into analog pulse width modulated signals without a D/A Converter includes an up-down counter, programmed by the digital signal, which provides a signal to logic circuitry at the conclusion of each count. The logic circuitry responds to the counter signal and clock signals coupled thereto to provide an analog pulse width modulated signal corresponding to the digital signal.

6 Claims, 3 Drawing Figures

DIGITAL SERVOMOTOR DRIVE APPARATUS

BACKGROUND OF THE INVENTION

1. Field of the Invention

This invention relates to servosystems for aircraft control surfaces, and more particularly, to a drive apparatus which directly converts digital data to pulse width modulated signals suitable for driving a d.c. servomotor.

2. Description of the Prior Art

In the flight control systems art, the recent development of digital autopilots has necessitated driving, with digital output data, servosystems which are typically analog input data devices. Digital-to-analog converters for converting the digital output data to an analog format have typically been utilized for this application. The converted analog data is then applied to a conventional servoamplifier to drive the servomotor in a conventional fashion. The utilization of a digital-to-analog converter and a conventional servoamplifier, however, is both slow and inefficient. Accordingly, there is a need for a faster and more direct means for driving a servomotor with digital data.

SUMMARY OF THE INVENTION

According to the invention, digital words from the data bus of a data processor are directly converted to signals having a plurality of current pulses with widths which are proportional to the digital words and which are suitable for driving a d.c. servomotor. The digital words are loaded into digital counting means which periodically counts down or up to zero, depending upon the polarity of the sign bit in the digital word and in response to a first signal having a predetermined pulse rate. Logic means, which is responsive to the digital counting means, provides output signals having pulse widths corresponding to digital words. Each pulse width is proportional to the magnitude of an individual digital word and a second signal having a predetermined fine clock rate. The logic means output signals are applied to a current amplifier which provides the pulse width modulated signals for driving the d.c. servomotor in either a clockwise or counter clockwise direction. A feedback loop having an analog-to-digital converter is utilized to provide the data processor with a digital feedback signal.

DESCRIPTION OF THE PREFERRED EMBODIMENT

Figure 1:
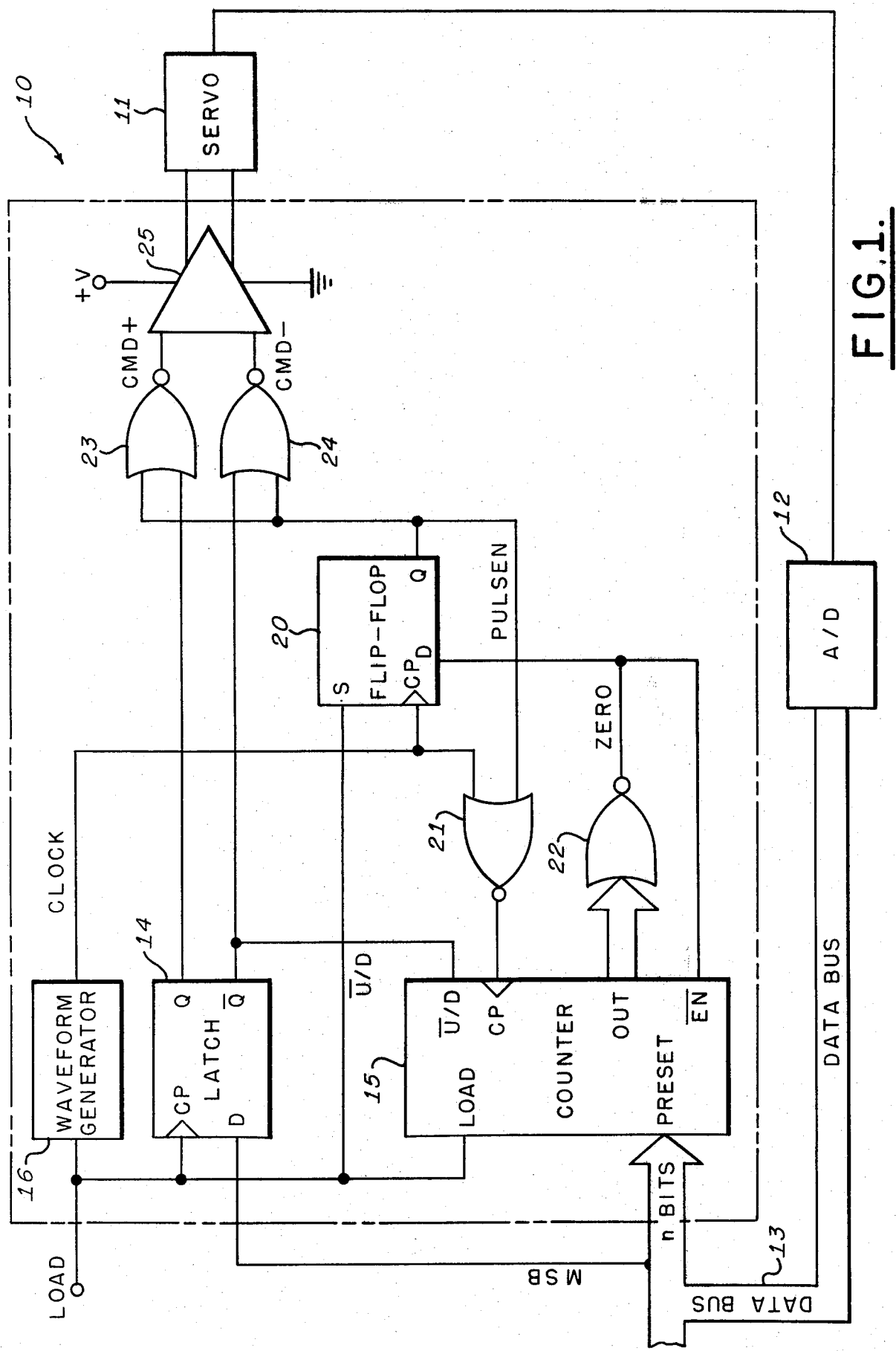
FIG. 1 is a block diagram of the present invention.

Referring now to FIG. 1, a block diagram of an apparatus 10 embodies the principles of the present invention. The apparatus 10 is responsive to digital data provided by a data processor or some other digital device and is ideally suited for driving a d.c. servomotor 11, thereby providing a direct and efficient interface between the data processor and a servosystem. The servomotor 11 is a d.c. electric motor of the type responsive to a pulse width modulated signal, and it is conventionally utilized to position aircraft control surfaces and the like. The servomotor 11 provides a feedback signal via a feedback loop having an analog-to-digital converter 12 included therein which converts the analog error signal from servomotor 11 into a digital format suitable for processing by the data processor.

Digital input data to the apparatus 10, as well as the digital feedback signal, are transmitted via an input/output data bus 13. The digital input data is in the form of digital words which are representative of commands for driving the servomotor 11. The servomotor 11 is driven in a direction and for a duration which corresponds respectively to the sign bit and magnitude of each digital word. Preferably, each digital word is comprised of nine significant bits, but it should be understood that either a larger or lesser number of significant bits may be utilized to practice the present invention. It should also be noted that a larger number of significant bits results in a capability for driving the servomotor 11 in finer degrees of resolution. Throughout the description of the present invention the MSB will represent the sign bit or polarity of each digital word and the remaining n bits will represent the magnitude of each digital word. Moreover, the invention will be described as converting two's complement digital words into pulse width modulated signals, but it should be further understood that if the hardware of the CPU of the associated data processor is designed for one's complement words, or some other format, the present invention may be modified for use therewith.

It can be appreciated from FIG. 1, that the MSB representative of the sign bit or polarity of the digital word is applied to a latch 14, and that the remaining n bits representative of magnitude are applied to counting means 15. Preferably the latch 14 is comprised of a d-type flip flop and the counting means 15 is comprised of at least one programmable digital counter, e.g., model 54 LS191, manufactured by Texas Instruments, Inc. It can be further appreciated from FIG. 1, that the apparatus 10 may be accessed through conventional address decoding logic by a 400 per second real time interrupt which is designated LOAD and which is applied to the latch 14, the counting means 15 and a waveform generator 16. The waveform generator 16 provides a signal which is designated CLOCK and which has a frequency of $2^n$ times the real time interrupt LOAD. Preferably, both the interrupt LOAD and the $2^n$ signal CLOCK would be derived from a standard counter timer, e.g., model 8253, manufactured by Intel Corporation, which would be coupled to the data processor's clock.

Logic means comprised of a d-type flip flop 20 and NOR gates 21, 22, 23, 24 is responsive to the CLOCK signal, the real time interrupt LOAD, and the output of the counting means 15, as hereinafter described in greater detail. The output signals of the logic means are provided by the output terminals of the NOR gates 23, 24. A current amplifier 25 which is coupled between a power supply and ground is responsive to the output of the NOR gates 23, 24. The current amplifier 25 provides pulse width modulated output signals which have pulses proportional to the magnitude of the digital words and which are suitable for driving the servomotor 11 in either direction. The servomotor 11 includes means for providing an analog feedback signal which is applied to an analog-to-digital converter 12 for conversion into a digital format. The digital output of the analog-to-digital converter 12 is applied to the data bus 13, thus establishing a closed loop feedback path for the servomotor 11.

Figure 2:
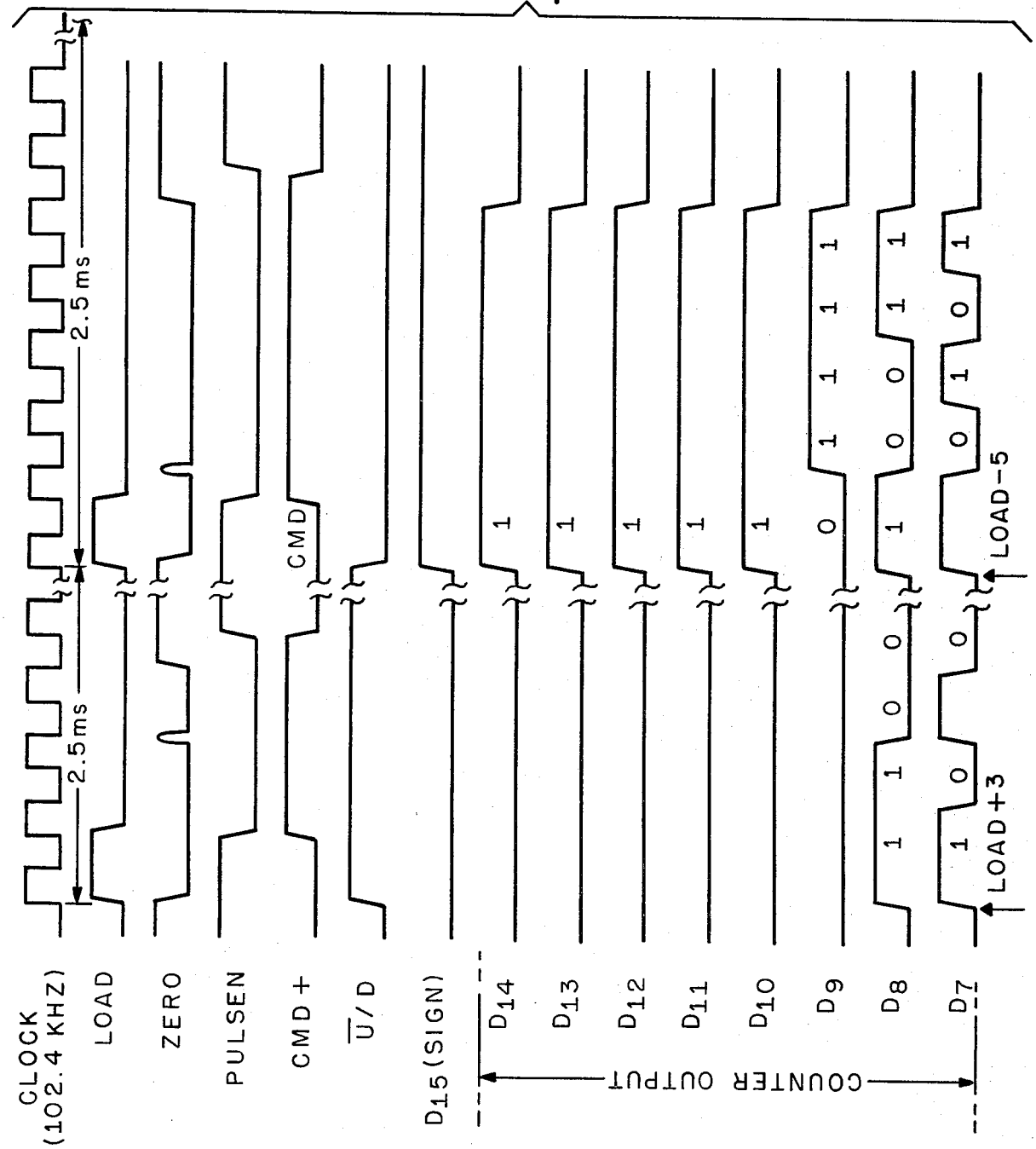
FIG. 2 is a timing diagram of various waveforms associated with the apparatus of FIG. 1.

Referring now to FIG. 2, a timing diagram depicts various waveforms at various points in the block diagram of FIG. 1. The waveform designated LOAD depicts the pulse train or real time interrupt provided to the apparatus 10. Preferably, the waveform LOAD includes 400 pulses per second, thus allowing the apparatus of the present invention to convert a digital word to a modulated pulse width every 2.5 milliseconds. Moreover, a 9 bit digital word having a sign bit and 8 remaining significant bits is preferably utilized to provide a resolution of 256 parts per pulse width or duty cycle. Since the pulse width or duty cycle is proportional to the magnitude of the digital word and a fine clock signal, the fine clock signal designated CLOCK therefore, preferably has a frequency of 256/2.5 ms, or 102.4 KHz in order to provide a 100% duty cycle. The waveform labeled ZERO is the D input to the flip flop 20 and the waveform labeled PULSEN is a common input to the NOR gates 21, 23, 24. The waveform labeled CMD+ is representative of the output of the NOR gate 23 and the waveform labeled CMD− is representative of the output of the NOR gate 24. The output signals of NOR gate 23 are pulse width modulated signals corresponding to the magnitude of positive digital words applied to the apparatus 10 whereas the output signals of NOR gate 24 correspond to the magnitude of negative digital words. The waveform labeled U/D is an input to the counter 15 instructing it to count either up or down depending upon the polarity or the sign bit of the digital word loaded in the counter. The first group of waveforms labeled D7 through D14 represents the output of the counter 15 and the waveform labeled D15 represents the output of the latch 14, when a digital word of +3 has been loaded into the counter 15. Similarly, the waveforms labeled D7 through D15 depict the counter and latch output waveforms when a digital word of −5 has been loaded into the counter 15.

Figure 3:
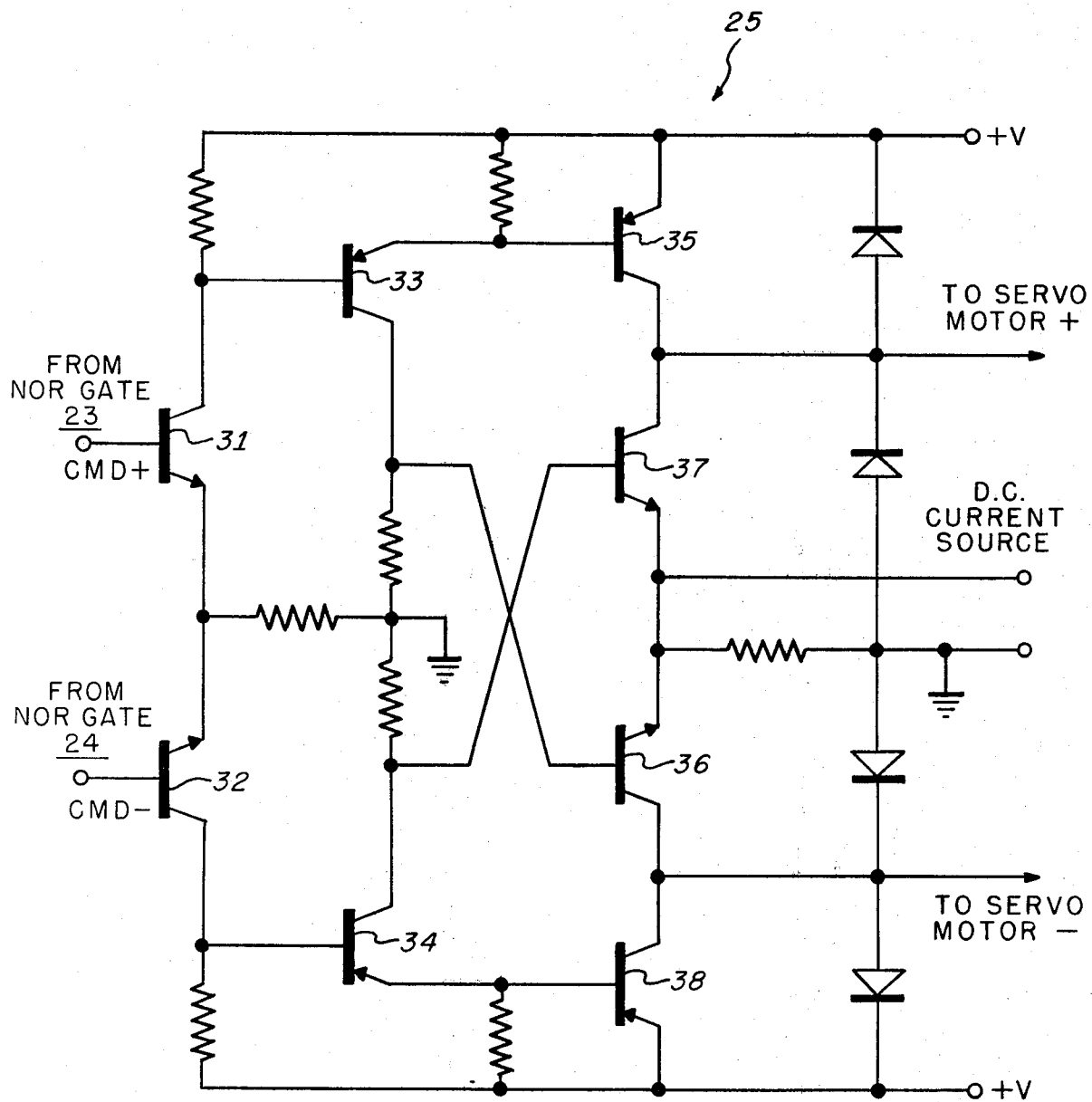
FIG. 3 is a schematic of a current amplifier included in the apparatus of FIG. 1.

Referring now to FIG. 3, a schematic illustrates a current amplifier 25 well adapted to amplify the output of NOR gates 23, 24 to levels suitable for driving the servomotor 11 in either a clockwise or counter clockwise direction. The current amplifier 25 is basically comprised of transistors, diodes, and resistors as illustrated in FIG. 3 and is designed to accommodate voltages on the order of +28 volts. When there is a CMD+ signal present at the output terminal of NOR gate 23, transistor 31 becomes conductive, which in turn causes transistors 33, 35, 36 to become conductive and which causes a current to be applied to the servomotor 11. Similarly, when there is a CMD− signal present at the output terminal of NOR gate 24, transistor 32 becomes conductive, which in turn causes transistors 34, 37, 38 to become conductive and which causes an opposite current to be applied to the servomotor 11.

In operation, the apparatus 10 of FIG. 1 converts two's complement digital words transmitted on the data bus 13 into command signals having pulse widths or duty cycles suitable for driving the servomotor 11. Initially, the pulse train LOAD having 400 pulses per second is applied to the waveform generator 16, the latch 14, and the programmable counter 15. Each pulse of the 400 cycle per second pulse train is a start pulse which causes the most significant bit of the digital word on the data bus 13 to be loaded into the latch 14 and the remaining n bits to be loaded into the programmable counter 15. The latch 14 is provided with a MSB of 1 when the digital word is negative. Moreover, since the digital word has a magnitude, the output of the programmable counter 15 will be some value other than 0, thereby causing the output of the NOR gate 22 to go to a logic 0. When the output of the NOR gate 22 is at a logic 0, the counter 15 is enabled. The pulse train of 400 cycles per second preferably causes the waveform generator 16 to provide a signal CLOCK having a frequency of 102.4 KHz which is applied to flip flop 20 and the NOR gate 21. The rising edge of the 102.4 KHz clock signal enables the flip flop 20 and the clock to the counter 15. When the counter 15 is enabled and clocked, it will count up to 0 for a digital word having a negative value and it will count down to 0 for a digital word having a positive value, as determined by the sign bit held in the latch 14 and provided to the input terminal labeled U/D of the counter 15. The NOR gates 23, 24 are responsive to the latch 14 and the flip flop 20. Thus, it can be appreciated that when a positive digital word is loaded into the counter 15 the current amplifier 25 is enabled by a positive command signal CMD+ provided by the NOR gate 23. The positive command signal CMD+ has a pulse width whose duration is proportional to the number of 102.4 KHz clock cycles occurring when the programmable counter 15 is counting. When the programmable counter 15 counts to 0, the output of the NOR gate 22 goes to a logic 1, thereby stopping the counter 15 and disabling the NOR gate 23 such that the current amplifier 25 no longer provides an output current. The current amplifier 25 continues not to provide a pulse width modulated output until another start pulse on the 400 cycle per second pulse train causes another digital word to be loaded into the counter 15, whereupon the functions of the apparatus 10 are repeated.

It should also be noted that the apparatus 10 of the present invention may be adapted to vary the pulse resolution as a function of the magnitude of the digital word. This variable resolution capability may be achieved by utilizing a programmable counter as the means to generate the signal CLOCK from the pulse rate LOAD. The data processor's software, for example, could double the resolution of the pulse width as the magnitude neared a null by determining when the magnitude of the desired pulse is less than half scale. The speed of the signal CLOCK could then be doubled by loading the programmable counter with the appropriate number and shifting the data left once before transmitting the data to the counter 15.

While the invention has been described in its preferred embodiment, it is to be understood that the words which have been used are words of description rather than limitation and that changes may be made within the purview of the appended claims without departing from the true scope and spirit of the invention in its broader aspects.

We claim:

1. An apparatus for converting digital words having a sign bit and a plurality of magnitude bits into analog signals having pulse widths corresponding to the magnitude bits and polarity corresponding to the sign bit, comprising:

waveform generator means for providing a first signal having a predetermined pulse rate and a second signal having a predetermined clock rate;

digital counting means, responsive to said first signal, for providing a count corresponding to said magnitude bits and said polarity bit of said digital words;

logic means responsive to said digital counting means and said second signal, for providing analog output signals having pulse widths proportional to said count and said clock rate of said second signal.

2. An apparatus according to claim 1 wherein said digital counting means includes at least one programmable counter responsive to the magnitude of said digital words and latching means responsive to the polarity of said digital words.

3. An apparatus according to claim 2 wherein the clock rate of said second signal is $2^n$ times the pulse rate of said first signal, n being a number that is one less than the number of significant bits in said digital words.

4. An apparatus according to claim 3 wherein said logic means comprises:

a first NOR gate responsive to the output of said programmable counter, a D type flip flop responsive to said first NOR gate and said first and second signals, a second NOR gate responsive to said D type flip flop and said second signal; and third and fourth NOR gates both responsive to the outputs of said D type flip flop and said latch means.

5. An apparatus according to claim 4 wherein said waveform generator means for providing said first and second signals includes a counter timer circuit responsive to the clock signal of a computer.

6. An apparatus according to claim 4 wherein said waveform generator means for providing said first and second signals includes a programmable counter for providing said second signal from said first signal.

* * * * *